US006763477B1

(12) United States Patent
McGee (10) Patent No.: US 6,763,477 B1
(45) Date of Patent: Jul. 13, 2004

(54) METHOD AND APPARATUS FOR TRANSMITTING AND RECEIVING DATA USING A SELF CLOCKING LINK PROTOCOL

(75) Inventor: James McGee, San Jose, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 567 days.

(21) Appl. No.: 09/629,494

(22) Filed: Jul. 31, 2000

(51) Int. Cl.[7] .............................. G06F 1/04; H03M 5/02
(52) U.S. Cl. ..................... 713/600; 713/500; 341/56
(58) Field of Search ................................ 713/500, 600; 341/56, 57, 58

(56) References Cited

U.S. PATENT DOCUMENTS

| | | | | |
|---|---|---|---|---|
| 3,611,141 A | * | 10/1971 | Waters | 375/292 |
| 3,666,890 A | * | 5/1972 | Wade | 370/206 |
| 4,373,152 A | * | 2/1983 | Jacobsthal | 341/56 |
| 4,449,119 A | * | 5/1984 | Hanna et al. | 341/70 |
| 4,486,739 A | | 12/1984 | Franaszek et al. | 341/59 |
| 4,688,016 A | | 8/1987 | Fok | 341/59 |
| 4,910,750 A | * | 3/1990 | Fisher | 375/292 |
| 5,191,330 A | * | 3/1993 | Fisher et al. | 341/56 |
| 5,525,983 A | * | 6/1996 | Patel et al. | 341/57 |
| 5,862,180 A | * | 1/1999 | Heinz | 375/244 |
| 6,114,979 A | * | 9/2000 | Kim | 341/57 |
| 6,240,523 B1 | * | 5/2001 | Rogers | 713/400 |

FOREIGN PATENT DOCUMENTS

| | | | | |
|---|---|---|---|---|
| JP | 358060857 A | * | 4/1983 | |
| JP | 360043263 A | * | 3/1985 | |
| JP | 360203023 A | * | 3/1985 | |

OTHER PUBLICATIONS

F. Aghdasi, "Systematic Design of Self–Clocked Circuits for VLSI Applications", New Directions in VLSI Design, Nov. 27, 1989, pp 1–16.*
P.T. Roine, "An Asynchronous PRBS Error Checker for Testing High–Speed Self–Clocked Serial Links", IEEE 1998, pp 133–141.*

* cited by examiner

*Primary Examiner*—Thomas Lee
*Assistant Examiner*—Chun Cao
(74) *Attorney, Agent, or Firm*—David A. Plattner (57) ABSTRACT

A receiver receives data using a restricted transition 2-out-of-4 encoding protocol that prohibits a transition from one encoding back to the same encoding, thereby ensuring that at least two signals change every transition. One encoding is assigned a meaning of "repeat", thereby ensuring that it is possible to transmit the same value repeatedly, and another encoding is assigned a meaning of "invert", thereby ensuring that is possible to transmit complement values repeatedly. The receiver driver includes a link differential receiver, a link receiver detector, a link receiver clock recovery unit, a link receiver valid data extender, and a link receiver decoder. A pair of signals carrying data encoded with the protocol are provided to the link differential receiver, which in turn asserts exactly one of six encoding signals that are provided to the link receiver detector. Using the six encoding signals, the link receiver detector generates 30 detector signals, which are provided to the link receiver clock recovery unit and the link receiver valid data extender. The clock recovery unit recovers a clock signal from the transitions and the link receiver valid data extender extends the period in which the data is valid. Finally, the link receiver decoder extracts the data carried by the protocol and provides the data to other circuits of the receiving block.

25 Claims, 6 Drawing Sheets

EARLY SAMPLING

LATE SAMPLING

METHOD AND APPARATUS FOR TRANSMITTING AND RECEIVING DATA USING A SELF CLOCKING LINK PROTOCOL

CROSS REFERENCE TO RELATED APPLICATIONS

This application contains subject matter related to a co-pending application Ser. No. 09/629,806 entitled "A self-Clocking Link Protocol" by James R. McGee, filed Jul. 31, 2000 (now abandoned) which has been assigned Hewlett-Packard Docket Number 10004143-1, and co-pending application Ser. No. 09/628,564 entitled "A Method and Apparatus for transmitting Data Using a Self-Clocking Link Protocol" by James R. McGee, filed Jul. 31, 2000 (now abandoned) which has been assigned Hewlett Packard Docket number 10005625-1. Both of these applications are hereby incorporated by reference, are assigned to the same assignee as the present application, and were filed on Jul. 31, 2000, which is also the date on which the present application was filed.

FIELD OF THE INVENTION

The present invention relates to receiving data in digital systems. More specifically, the present invention relates to a receiver that receives data in digital systems using a protocol that allows data to be transmitted without using a separate clock signal.

DESCRIPTION OF THE RELATED ART

In the art of digital signal processing, which of course includes the art of computing, it is common to transmit data from a sending block, such as a sending integrated circuit (IC) to a receiving block, such as a receiving IC. Typically, the sending block provides the data on one or more data lines, and a clock distribution network transmits a clock signal to the sending block and the receiving block on one or more clock lines. The sending block uses the clock signal to control the transitions on the data lines as data is transmitted, and the receiving block uses the clock signal to validate the received data.

As is known in the art, designing a clock distribution network is not a trivial task. Clock signal skew must be tightly controlled to ensure that the data is properly transmitted at the sending block and validated at the receiving block. Often when a block is inserted into a digital system, for example, adding an IC to a location of a printed circuit board reserved for expansion or some other type of option, the added block affects the loading of the clock distribution network differently than the loading of the data lines. This problem is addressed in U.S. Pat. No. 5,987,576 to Leith L. Johnson, et al, which is entitled "Method and Apparatus for Generating and Distributing Clock Signals with Minimal Skew", is assigned to the same assignee as the present application, and is hereby incorporated by reference.

Another area that requires considerable attention by a logic designer is transferring data from the clock domain of the sending block to the clock domain of the receiving block as data is received at the receiving block. In synchronous systems operating at the same frequency, as the distance and loading associated with the clock and data signals coupling the sending and receiving blocks vary, the phase difference between the two clock domains also varies. This problem is addressed by Paul L. Rogers in co-pending U.S. application Ser. No. 09/365,055, which was filed on Jul. 30, 1999, is entitled "A Method and Apparatus for Automatically Determining the Phase Relationship Between Two Clocks Generated from the Same Source", and is assigned to the same assignee as the present application. This application is hereby incorporated by reference. In asynchronous systems operating at different frequencies, other techniques are used, such as handshaking or operating the receiver circuit at a frequency significantly faster than the switching frequency of the data signals.

The teachings of Rogers and Johnson et al. are cited merely to illustrate that the generation and distribution of clock signals require significant attention during the design of a digital circuit. Furthermore, clock distribution networks consume significant hardware resources, such as I/O pins on the ICs, clock buffers, and traces on the printed circuit board. Also, clock distribution networks consume considerable power because the clock signals operate at high frequencies and often drive many clock inputs. And of course, clock distribution networks do not actually carry any data.

In theory, many of the issues discussed above can be eliminated if the clock signal can be embedded in the data stream. For example, in the art of magnetic storage, hard disk drives often store data using protocols known in the art as run-length limited (RLL) codes, as taught by Wilson W. Fok in U.S. Pat. No. 4,688,016, which is entitled "Byte-Wide Encoder and Decoder System for RLL(1,7) Code" and is hereby incorporated by reference. In the family of RLL codes, the RLL(1,7) code has gained wide acceptance. In accordance with the RLL(1,7) coding format, a sequence of unencoded binary data is converted into an encoded bit string in which each "1" in a coded bit sequence must be separated from the nearest adjacent "1" by at least one, but no more than seven "0s". In this format, the most efficient coding rate results when every two unencoded data bits are converted into three coded bits. Conversely, in the decoding process, three coded data bits are converted into two decoded data bits.

Typically the clock signal is recovered from the RLL(1,7) data stream using a phase-locked loop. Often a synchronization field precedes the data field. The synchronization field provides a clock signal having hundreds or thousands of regularly spaced transitions and allows the phase-locked loop to train, or alternatively, lock on to the clock signal from the synchronization field. After the phase-locked loop is trained to the clock signal provided in the synchronization field, the RLL(1,7) data stream is provided from the data field. A phase comparator of the phase-locked loop compares transitions in the data stream with transitions in a clock signal provided by the phase-locked loop. If the transitions are not aligned, the phase comparator will issue a "pump-up" or "pump-down" signal to a voltage-controlled oscillator of the phase-locked loop to cause the clock signal provided by the phase-locked loop to remain synchronized with the data. Since RLL(1,7) code requires at least one, but no more than seven "0s" between "1s", the phase-locked loop is guaranteed to have a data stream transition to compare with the clock signal at least once every seven clock signals.

Another protocol that embeds a clock signal in a data stream is disclosed by Peter A. Franaszek et al. in U.S. Pat. No. 4,486,739, which is entitled "Byte Oriented DC Balanced (0,4) 8B/10B Partitioned Block Transmission Code" and is hereby incorporated by reference. The protocol disclosed by Franaszek et al. is an RLL(0,4) code, which ensures a transition at least every four clock cycles, and encodes 8 bits into 10 bits, thereby providing a coding efficiency of 80%.

Similar to the RLL(1,7) code discussed above, the protocol disclosed by Franaszek et al. typically requires a phase-locked loop to recover the clock signal from the data signal. Phase-locked loops tend to be relatively complex circuits, and are often implemented using analog circuitry. Furthermore, phase-locked loops can require hundreds or thousands of clock cycles to train onto a signal. For many types of errors, the phase-locked loop must retrain onto the signal. Also phase-locked loops can drift between clock and data edge comparisons. This drifting can be visualized as a variable skew that limits the ultimate data transfer rate. What is needed in the art is a self-clocking protocol that includes a clock signal, such as the protocol disclosed by Franaszek et al. and the RLL(1,7) code discussed above, without requiring a phase-locked loop to recover the clock signal from the data stream.

SUMMARY OF THE INVENTION

The present invention is a method and apparatus for receiving data using a self-clocking link protocol which allows data to be received without the use of a separate clock signal and without requiring a phase-locked loop to recover a clock signal from the data signal. The present invention may advantageously be used in any application where data is transmitted from one digital block to another.

A protocol for use with a receiver in accordance with the present invention is implemented using m-out-of-n encodings, with restricted transitions allowed between the encodings. By restricting the transitions, the receiver of the present invention ensures that a transition edge is present on at least two data lines carrying the protocol for every data transmission. This property allows received data to be recovered without requiring a phase-locked loop. In addition, if desired it is also possible to recover a clock signal from the received data.

As is known in the art, an m-out-of-n encoding is a binary code with a width of n bits, with exactly m bits of these n bits having a value of "1" and the other n-m bits having a value of "0". There are n!/[m!(n-m)!] encodings possible in an m-out-of-n encoding.

The restricted transition 2-out-of-4 encoding used by the receiver of the present invention provides a self-clocking link protocol capable of receiving two bits every transition. The restricted 2-out-of-4 encoding uses 4 signals and two of the bits in each encoding must have a value of "1", thereby providing a total of six encodings.

The encodings can be assigned the meanings "0", "1", "2", "3", "repeat", and "invert". The allowed transitions are restricted such that the next encoding cannot be the same encoding and cannot be the inverse encoding. This restriction provides the restricted transition 2-out-of-4 encoding of the present invention with a self-clocking feature because exactly two signals change with every transition between encodings.

Each encoding has four possible allowed transitions, thereby allowing two bits of data to be transmitted every encoding transition. Whenever the "0", "1", "2", and "3" encodings are transferred, the corresponding values of "0", "1", "2", and "3", respectively, result when the encodings are decoded. After transferring one of "0", "1", "2", or "3" encodings, assume that the next value to be transferred is the same value. Since there is no allowed transition to the encoding representing the same value, the "repeat" encoding is transferred. Similarly, if the next value to be transferred is the complement value, the "invert" encoding is transferred.

A receiver in accordance with the present invention includes a link differential receiver, a link receiver detector, a link receiver clock recovery unit, a link receiver valid data extender, and a link receiver decoder. Incoming data is received via a transfer medium by the link differential receiver.

The link differential receiver determines which of the six encodings are present on the input signals, and asserts exactly one of six separate encoding signals corresponding to that encoding. The encoding signals are in turn provided to the link receiver detector. The link receiver detector includes a series of flip-flops and stores information derived from the current encoding and previous encodings. The detector produces 30 detector signals, which are labeled to correspond with each possible transition from one encoding to another, including the prohibited transition to the complement value, but excluding the prohibited transition back to the same value.

The 30 detector signals are provided to the link receiver clock recovery unit and the link receiver valid data extender. The link receiver clock recovery unit receives the detector signals and recovers a clock signal from the transitions in the detector signals. The clock signal is provided to the link receiver decoder and to other circuits in the receiving block.

The link receiver valid data extender also receives the detector signals and generates extended encoding signals, which remain "1" for one additional encoding transition, thereby simplifying the task of decoding the values from the encodings. Accordingly, at any instant in time two of the extended encoding signals are asserted as "1" and the others are deasserted as "0".

The extended and non-extended encoding signals are provided to the link receiver decoder, which in turn produces the decoded data at a pair of data lines. The decoded data is than transmitted to other circuits in the receiver block. Note that these other circuits may use a separate clock to receive the decoded data, or may use the clock provided by the link receiver clock recovery unit.

The present invention provides many advantages over the prior art. For example, a design implementing the present invention can have a simplified clocking distribution network because separate clock signals are not required to transmit data between blocks. In addition, phase-locked loops are not required to extract the clock signal from the data stream. Also, the present invention provides higher transfer rates than many prior art techniques.

DETAILED DESCRIPTION OF THE PREFERRED EMBODIMENTS

The present invention is a method and apparatus for receiving data using a self-clocking link protocol which allows data to be transmitted without the use of a separate clock signal and without requiring a phase-locked loop to recover a clock signal from the data signal. The present invention may advantageously be used in any application where data is transmitted from one digital block to another.

A protocol for use with a receiver in accordance with the present invention is implemented using m-out-of-n encodings with restricted transitions allowed between the encodings. By restricting the transitions, a transition edge is present on at least two data lines carrying the protocol for every data bit transmitted. This property allows received data to be recovered without requiring a phase-locked loop. In addition, if desired it is also possible to recover a clock signal from the received data.

Before discussing the receiver circuit of the present invention below, first consider the protocol used by the receiver. The protocol will be referred to herein as a restricted transition 2-out-of-4 encoding, and is one of a family of protocols that will be referred to herein as restricted transition m out of n encodings. This family of protocols is fully described in a co-pending application Ser. No. 09/629,806 entitled A Self Clocking Link Protocol by James R McGee which has been assigned Hewlett Packard Docket Number 10004143-1, is assigned to the same assignee as the present application was filed, and is incorporated by reference above.

As is known in the art, an m-out-of-n encoding is a binary code with a width of n bits, with exactly m bits of these n bits having value of "1" and the other n-m bits having value "0". There are n!/[m!(n-m)!] encodings possible in an m-out-of-n encoding. Without any restrictions governing the transitions allowed between encodings, any encoding can follow any other encoding. Accordingly, the same encoding can occur two times in a row. For this reason, prior art m-out-of-n encodings are not self-clocking.

In the prior art, differential signaling is often used to transmit clock and data signals over a link. As is known in the art, a differential signal is typically carried by a pair of conductors, with one conductor carrying the complement of the other conductor.

Conceptually, differential signaling can be viewed as the simplest form an m-out-of-n encoding since there are two signals and one of the two signals has a value of "1". In other words, differential signaling is a 1-out-of-2 encoding. However, since data is merely being sent as the actual value and the complement value, differential signaling is not generally viewed as an encoded form of data transmission.

The restricted transition 2-out-of-4 encoding used by the receiver of the present invention provides a self-clocking link protocol capable of transmitting two bits every transition. Before considering the restricted transition 2-out-of-4 encoding, first consider how data is transmitted using two pairs of differential signals.

Figure 1:
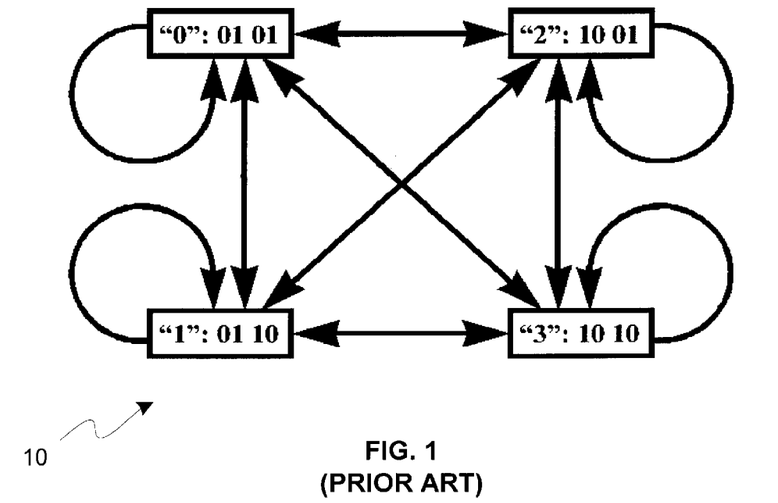
FIG. 1 shows a transition diagram that illustrates how a pair of differential signals are typically interpreted in the prior art.

FIG. 1 shows a transition diagram 10 that illustrates how a pair of differential signals are typically interpreted in the prior art. Note that there are four encodings; "0", "1", "2", and "3". Also note that there are not any restrictions on the transition to the next encoding. In other words, the next encoding can be any encoding, including the current encoding. Therefore, a pair of differential signals can transfer two bits every clock cycle.

A pair of differential signals is not self-clocking because there is never a guaranteed transition. Accordingly, a clock signal is typically used to transfer data using a pair of differential signals. Usually the clock signal is carried by a separate differential signal, so six conductors are required.

Figure 2:
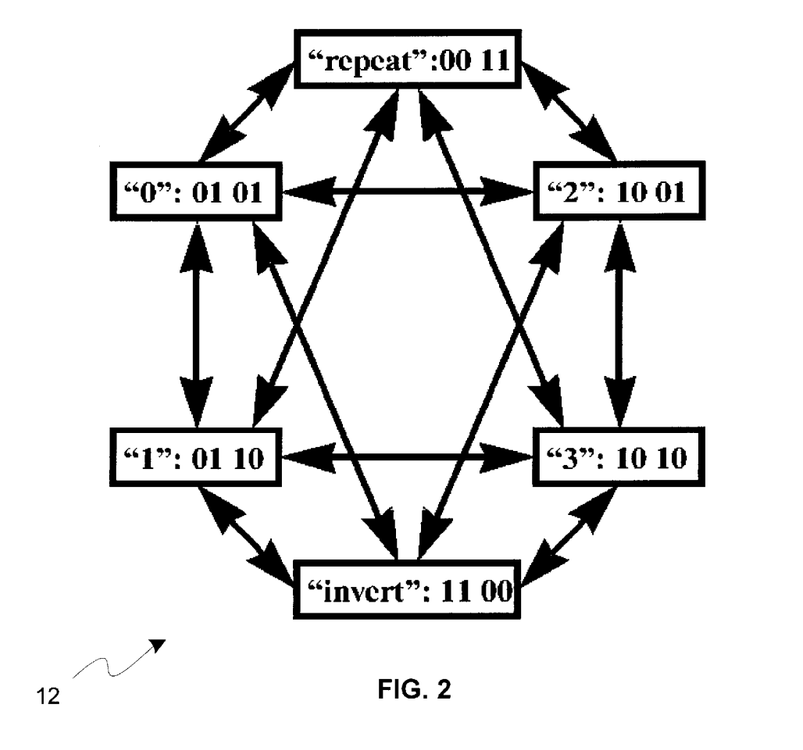
FIG. 2 shows a transition diagram that illustrates a restricted 2-out-of-4 encoding used by a receiver in accordance with the present invention.

FIG. 2 shows a transition diagram 12 that illustrates the restricted 2-out-of-4 encoding used by the receiver circuit of the present invention. Like the encoding for the pair of differential signals shown in FIG. 1, the restricted 2-out-of-4 encoding also uses 4 signals. Accordingly, there are 4!/[2!(4-2)!]=6 encodings.

These encodings include the same encodings as a differential pair ("0", "1", "2", and "3"), plus two additional encodings. These additional encodings have been defined as "repeat" and "invert".

While the restricted 2-out-of-4 encoding includes all the encodings of a prior art differential pair, note that the transition from any particular encoding to the next encoding is restricted. Specifically, the next encoding cannot be the same encoding and cannot be the inverse encoding. This restriction provides the restricted transition 2-out-of-4 encoding with a self-clocking feature because exactly two signals change with every transition between encodings.

Note that each encoding has four possible allowed transitions. Therefore, like two prior art differential pairs, the restricted transition 2-out-of-4 encoding can transfer the equivalent of two bits of data every encoding transition. As shown in FIG. 2, these encodings are defined to have the values "0", "1", "2", "3", "repeat", and "invert". Whenever the "0", "1", "2", and "3" encodings are transferred, the corresponding values of "0", "1", "2", and "3", respectively, result when the encodings are decoded.

After transferring one of "0", "1", "2", or "3" encodings, assume that the next value to be transferred is the same value. As discussed above, there is no allowed transition to the encoding representing the same value. Accordingly, the "repeat" encoding is transferred. If the same value is to be transferred a third time, the encoding for that value can be transferred directly. Therefore, the restricted transition 2-out-of-4 encoding can repeatedly send the same value by alternating between the encoding for that value and the "repeat" encoding, while also providing a clock signal within the data stream.

Now assume that after transferring one of "0", "1", "2", or "3" encodings, the next value to be transferred is the complement value. As discussed above, there is no allowed transition to the encoding representing the complement value. Accordingly, the "invert" encoding is transferred. Therefore, the restricted transition 2-out-of-4 encoding can continuously alternate between sending a value and the complement of that value by alternating between the encoding for that value and the "invert" encoding, while also providing a clock signal within the data stream. Note that there are no allowed transitions between the "repeat" or "invert" encodings, and the "repeat" and "invert" encodings cannot transition back to themselves. However, these transitions are not needed since a transition to one of the "0", "1", "2", or "3" encodings is always allowed from either the "repeat" or "invert" encodings.

Note that both a driver and a receiver designed to use the restricted transition 2-out-of-4 encoding must maintain one transfer worth of state information to determine the meaning of the transferred values by decoding the "repeat" and "invert" encodings. The driver circuit is discussed in greater detail in the co-pending application Ser. No. 09/628,564 entitled "A method and Apparatus for Transmitting Data Using a Self-clocking Link Protocol" by James R McGee, which has been assigned Hewlett-Packard Docket Number 10005625-1. This Application is incorporated by reference above, is assigned to the same assignee as the present application, and was filed on Jul. 31, 2000, which is also the date on which the present application was filed.

Figure 3:
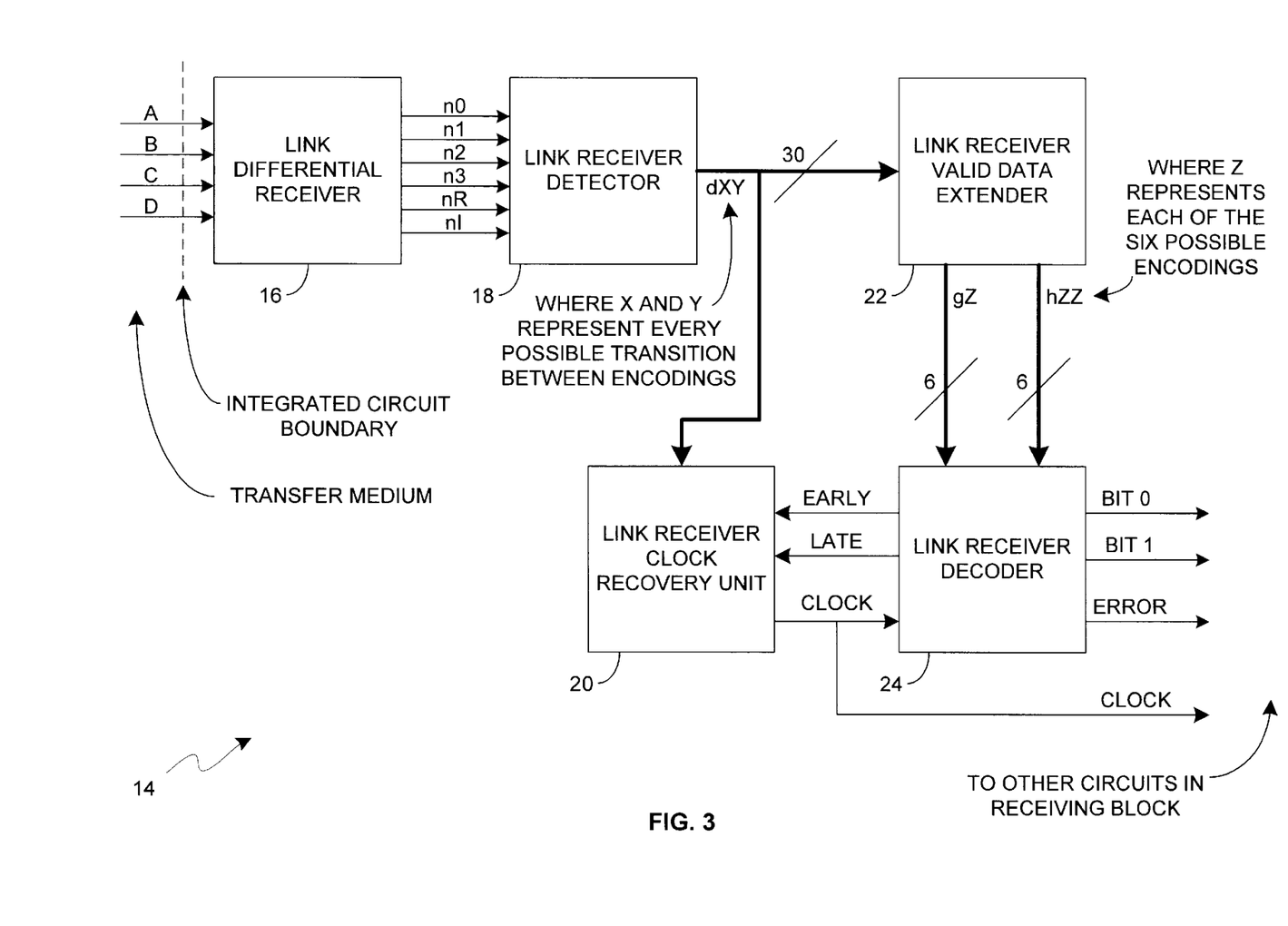
FIG. 3 is a block diagram of a receiver in accordance with the present invention capable of receiving data using the restricted transition 2-out-of-4 encoding shown in FIG. 2.

In accordance with the present invention, FIG. 3 is a block diagram of a receiver 14 capable of receiving data using the restricted transition 2-out-of-4 encoding described above. Those skilled in the art will understand how to adapt the teachings included herein to implement receivers capable of receiving data using any of the restricted transition m-out-of-n encodings described in the co-pending application entitled "A Self-Clocking Link Protocol" by James R. McGee, which was incorporated by reference above.

Receiver 14 includes link differential receiver 16, link receiver detector 18, link receiver clock recovery unit 20, link receiver valid data extender 22, and link receiver decoder 24. Incoming data is received via a transfer medium over signals A, B, C, and D from a sending block using the restricted transition 2-out-of-4 encoding protocol described above. The incoming data present in signals A, B, C, and D is provided to link differential receiver 16.

Link differential receiver 16 determines which of the six encodings are present on the signals A, B, C, and D, and asserts one of the signals n0, n1, n2, n3, nR, or nI. Note that the numbers "0", "1", "2", and "3", represent encodings for their respective values and the letters "R" and "I" represent encodings "repeat", and "invert", respectively. Also note that these signals are active low, so for any valid encoding present on the signals A, B, C, and D one of the signals n0, n1, n2, n3, nR, or nI will be "0" and the others will be "1".

Link receiver detector 18 receives the signals n0, n1, n2, n3, nR, and nI from link differential receiver 16. Detector 18 includes a series of asynchronous flip-flops and stores information derived from the current encoding and previous encodings, as will be discussed in greater detail below, and produces 30 signals, which are labeled in FIG. 3 as dXY. X and Y represent each possible transition from one encoding to another, including the prohibited transition to the complement value, but excluding the prohibited transition back to the same value. Accordingly, there are six encodings and five transitions from each encoding, thereby producing the 30 dXY signals. As will be seen below, individually the signals have labels such as d23, dR0, d10, and d3I, with the numbers "0", "1", "2", and "3", and the letters "R" and "I" representing the encodings.

The 30 dXY signals are provided to link receiver clock recovery unit 20 and link receiver valid data extender 22. Clock recovery unit 20 receives the dXY signals and recovers a clock signal from the transitions in the dXY signals. The clock signal is provided to link receiver decoder 24 and to other circuits in the receiving block.

Link receiver valid data extender 22 receives the dXY signals and generates the signals gZ and hZZ. In FIG. 3, the labels gZ and hZZ each represent six signals, with Z representing the encoding. One of the signals represented by gZ is asserted as "1" when the corresponding encoding is received at the inputs A, B, C, and D, and remains "1" only as long as the corresponding encoding is present at the inputs. The other gZ signals are deasserted as "0". In contrast one of the signals represented by hZZ is asserted as "1" when the corresponding encoding is received at the inputs A, B, C, and D, and remains "1" for one additional encoding transition. Accordingly, at any instant in time two of the hZZ signals are asserted as "1" and the others are deasserted as "0".

The signals gZ and hZZ are provided to link receiver decoder 24, which in turn produces the decoded data at the data lines BIT 0 and BIT 1. The decoded data is then transmitted to other circuits in the receiver block. Note that these other circuits may use a separate clock to receive the decoded data, or may use the clock provided by link receiver clock recovery unit 20. Also note that link receiver decoder 24 is capable of detecting certain types of errors and asserting an error signal, as will be discussed in greater detail below.

In one embodiment, link receiver decoder 24 operates asynchronously without receiving a clock signal from unit 20. In another embodiment, decoder 24 operates synchronously and uses the clock signal, as is shown in FIG. 3.

One optional feature provided by decoder 24 is the ability to compare the clock signal generated by unit 20 with the data transitions in the signals gZ and hZZ. If the clock is found to be either early or late, decoder 20 either asserts the "early" or "late" signal to unit 20. Unit 20 includes a variable delay that allows the clock edge to be aligned with the transition edges in the signals gZ and hZZ.

Figure 4:
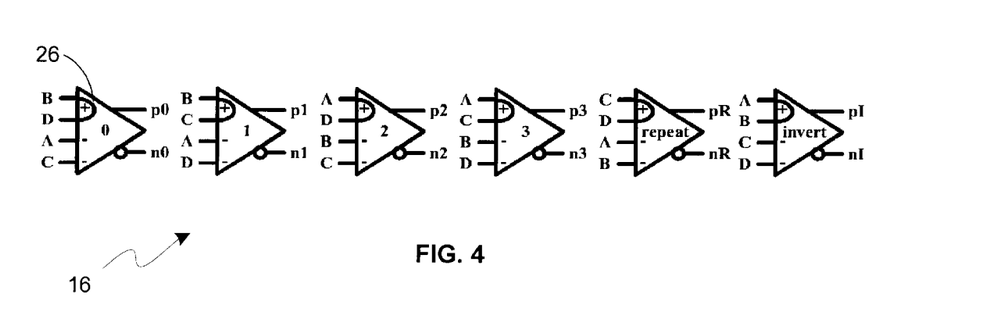
FIG. 4 shows a block diagram of a link differential receiver, which is part of the receiver of FIG. 3.

FIG. 4 shows a block diagram of link differential receiver 16. As discussed above, there are six possible encodings in the restricted transition 2-out-of-4 encoding protocol, and each of these six encodings has a dedicated link differential receiver component, such as component 26 for encoding "0". Note that each component is labeled with the encoding meaning detected by that particular component, with the outputs "pR" and "nR" representing the "repeat" encoding and the outputs "pI" and "nI" for the "invert" encoding. The "p" outputs are non-inverting outputs and are asserted as "1" when an encoding is detected, and the "n" outputs are inverting and are asserted as "0" when an encoding is detected. Note that in FIG. 3, only the "n" outputs are provided to link receiver detector 18. However, those skilled in the art will appreciate that "p" could be used instead via a level adjusting inversion.

Note that the outputs "p0", "p1", "p2", "p3", "pR", and "pI" are "one-hot" outputs; i.e., exactly one of these outputs is asserted as "1" at any time for the restricted transition 2-out-of-4 encoding. Similarly, exactly one of the outputs "n0", "n1", "n2", "n3", "nR", and "nI" is asserted as "0" at any given time.

Since the same differential transition on the inputs (A,B, C,D) are provided to each component, the edges between changing pairs of the signals "n0", "n1", "n2", "n3", "nR", and "nI" are well aligned, with the only skew present produced by the skew between the individual components. Due to the nature of the restricted transition 2-out-of-4 encoding, when any component output is asserted for a data transfer, that output will not be asserted during the following data transfer. Similarly, when any component output is asserted for a data transfer, the output for the complement encoding will not be asserted during the following data transfer.

Figure 5:
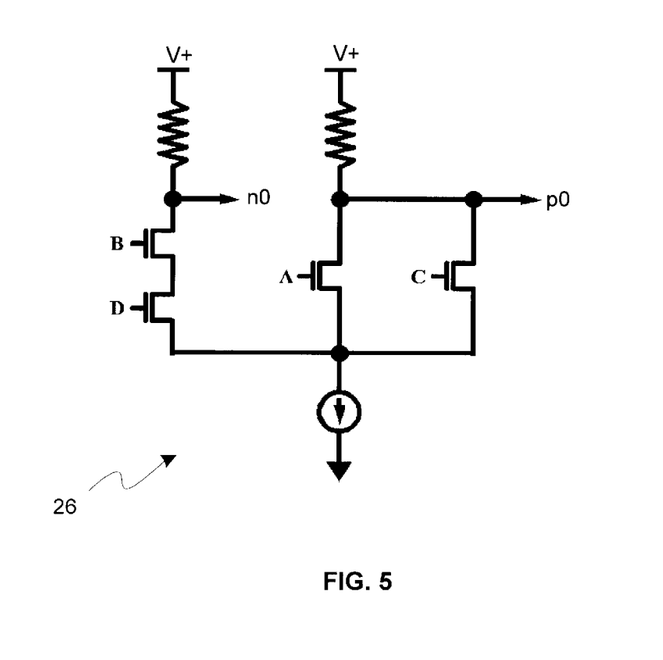
FIG. 5 is a schematic diagram of one of the link differential receiver components that form the link differential receiver of FIG. 4.

FIG. 5 is a schematic diagram of link differential receiver component 26 of FIG. 4. Note all the components shown in FIG. 4 are identical. In the discussion below, each transistor will be referred to by the label of the input signal that drives that transistor.

To understand the operation of link differential receiver component 26, consider the transition from (A,B,C,D)=(0,1,0,1) to (A,B,C,D)=(1,0,0,1). Before the transition, with B=D=1, transistors B and D are turned on and n0 is asserted as "0". Note that (A,B,C,D)=(0,1,0,1) is the only allowed encoding in the restricted transition 2-out-of-4 encoding that has B=D=1. Also since A=C=0, transistors A and C are turned off and p0 is asserted as "1". Note that (A,B,C,D)=(0,1,0,1) is the only allowed encoding in the restricted transition 2-out-of-4 encoding that has A=C=0.

During the transition, the two signals C and D do not change, with C remaining "0" and D remaining "1". Therefore, during the transition transistor C remains turned off and transistor D remains turned on. Accordingly, during this transition component 26 can be reduced to an equivalent circuit where transistor C is removed from the circuit and transistor D is replaced by a virtual short. The resulting equivalent circuit is a differential amplifier with inputs A and B, and inputs A and B are making a differential transition, thereby deasserting n0 to a value of "1" and deasserting p0 to a value of "0".

Note that component 26 switches cleanly for the transition from (A,B,C,D)=(0,1,0,1) to (A,B,C,D)=(1,0,0,1). There are four transitions possible starting from (A,B,C,D)=(0,1,0,1). The resulting encoding after the transition for these transitions is one of (1,0,0,1), (1,1,0,0), (0,0,1,1), or (0,1,1,0). For each of these four transitions, the component 26 acts effectively as a differential amplifier between the two inputs that are making a differential transition. Note that component 26 also acts as a differential amplifier for the same transitions in the opposite direction, i.e., any allowed transition into (A,B,C,D)=(0,1,0,1). In summary, for all transitions allowed by the restricted transition 2-out-of-4 encoding either into or out of the encoding (A,B,C,D)=(0,1,0,1), component 26 acts as a differential amplifier to detect the differential transition on the changing signals.

Figure 6:
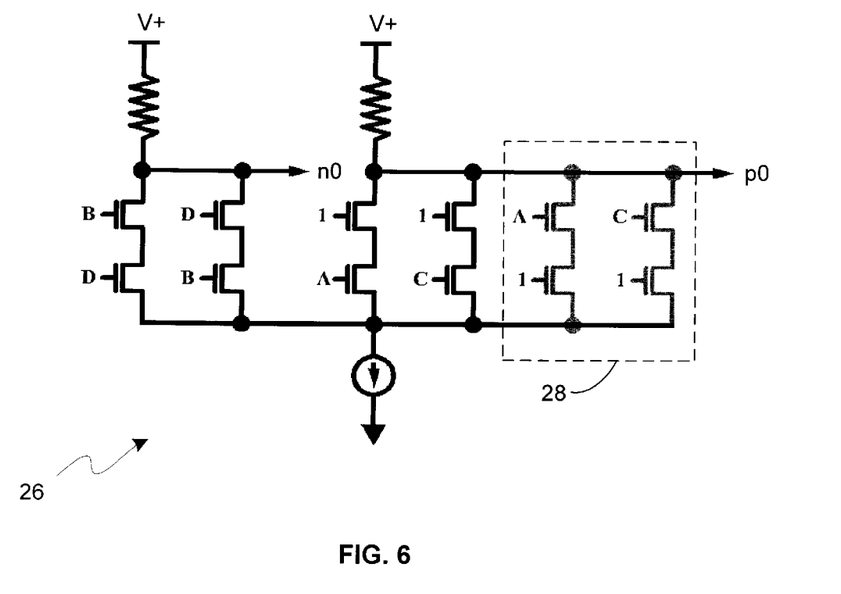
FIG. 6 is a schematic diagram of a modified implementation of the link differential receiver component shown in FIG. 5.

In practice, component 26 may be modified as shown in FIG. 6 to increase the symmetry among the inputs. The "1" inputs should be tied to a voltage that approximates the received high level in the signals A, B, C, and D. The rightmost four transistors within dotted line box 28 are optional since they minimally affect the operation of component 26.

Link differential receiver 16 essentially detects when there are changes in the two signals with the highest received voltage as compared to the higher voltage of the two remaining signals. The circuitry and timing can be designed so that the cases of three or four signals crossing simultaneously can be safely ignored. Then link differential receiver 16 detects the crossings between the two signals with the middle two voltages among the four signals. For link differential receiver 16 to operate properly, the signal crossings carrying each data transfer must occur at a voltage that is between (with sufficient noise margin) the other two signals, one high and one low, that are not changing during the data transfer. In addition, the crossings must be separated with sufficient "eye opening" width and/or area to allow subsequent detection circuitry to separately detect each data transfer.

Those skilled in the art will appreciate that essentially the same circuitry can be built using current sensing circuitry, such as bipolar transistors, instead of the voltage sensing circuitry presented here. In addition, essentially the same circuitry can be built using P-channel transistors. Note that both N-channel and P-channel link differential receiver components can be used with their outputs combined.

Figure 7:
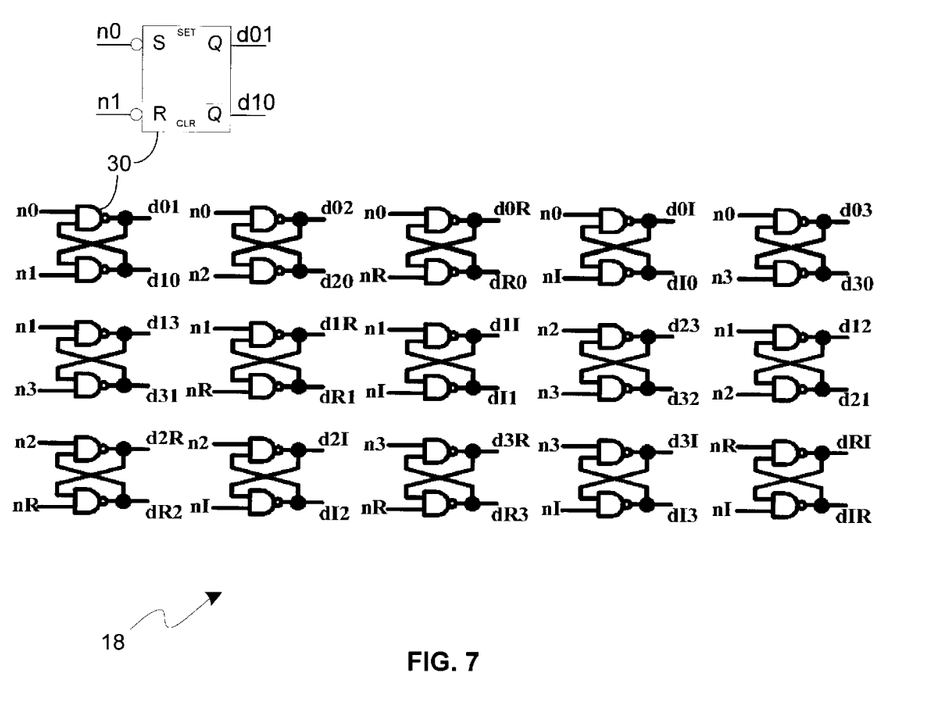
FIG. 7 shows a schematic diagram of a link receiver detector, which is part of the receiver of FIG. 3.

FIG. 7 shows a schematic diagram of link receiver detector 18. Link receiver detector 18 consists of 15 not-set not-reset asynchronous flip-flops. Note that a logical symbol is also shown for flip-flop 30. An n output from each of the six link differential receiver components of link differential receiver 16 is fed into five of the 15 flip-flops. There is one flip-flop for each unique pair of link differential receiver components. The regenerative feedback of each flip-flop acts to quickly produce a full signal swing on the flip-flop outputs after either or both of the inputs that are changing have crossed the NAND gate threshold voltage.

When an encoding is presented to detector 18, five flip-flops are put into a particular state. For example, when the encoding for "0" is received (by the signal n0 being asserted as "0"), the five flip-flops across the top of FIG. 7 are put into a state that causes the outputs d01, d02, d0R, d0I, and d03 to be asserted as "1". Note that the outputs of the flip-flops are collectively shown in FIG. 3 as dXY. The other 10 flip-flops maintain their prior state. At least one of these five flip-flops must toggle to reach that state, and the other four may or may not toggle depending upon the number of encodings other than the "0" encoding that have been transferred since the last time that "0" encoding was transferred.

During normal operation, there are 576 different combinations possible for the outputs of link receiver detector 18. These combinations are sufficient to determine the current and prior data transfer encoding, and therefore are sufficient to decode the current data transfer, including the decoding of the "repeat" and "invert" encodings. If the outputs of link receiver detector 18 are sampled, it is possible that this sampling may be performed while the link detector outputs are making a transition. Since up to five link detector outputs can change for one data transfer, the sampled link detector outputs may not be one of the normal 576 combinations possible, and in some cases these sampled link detector outputs cannot be used to determine either the current or prior encoding. However, these issues are addressed by link receiver clock recovery unit 20 and link receiver valid data extender 22, which are discussed below.

On power-up, or upon encountering errors, the link receiver detector outputs may go into a state that is not one of the normal 576 possible combinations. A short training sequence, such as visiting every encoding once, will initialize link receiver detector 18.

Before continuing with the discussion of link receiver clock recovery unit 20 below, first consider several issues related to the link receiver detector 18. The purpose of link receiver detector 18 is to amplify the outputs of link differential receiver 16 to a full signal swing, while minimizing the required "eye opening" and extending (or at least not significantly diminishing) the valid data time. To minimize the "eye opening" required by detector 18, the asynchronous logic feedback path in the flip-flops is kept as short as possible.

In theory, it is possible to combine link receiver detector 18 and link receiver decoder 24 into a single stage by adding two edge-triggered toggle input flip-flops with level or edge reset and set inputs to store the previously transmitted encoding. Appropriate combinations of the component outputs of link differential receiver 16 corresponding to the "0", "1", "2", and "3" encodings are fed into the appropriate reset and set inputs of the flip-flops. A "pI" or "nI" output, as appropriate, is fed into the toggle input of both flip-flops to properly decode the "invert" encoding. While the "pR" and "nR" outputs may be used to generate a validation transition, these outputs do not need to be provided to the flip-flops because the value to be repeated is already stored in the flip-flops.

Unfortunately, combining link receiver detector 18 and link receiver decoder 24 lengthens the worst case feedback path, thereby increasing the required "eye opening". The "eye opening" may need to be further increased to obtain the valid data time required by subsequent logic. Therefore, to minimize the required "eye opening", it is desirable to separate link receiver detector 18 and link receiver decoder 24, as is shown in FIG. 3.

Those skilled in the art will appreciate that a set reset asynchronous flip-flop constructed from cross-connected NOR gates can be substituted for the not-set not-reset flip-flops shown in FIG. 7, and essentially the same circuit would result. Furthermore, other flip-flop implementations, such as cross-connected invertors with NMOS overdrive pull-downs on the inputs, can be used and essentially the same circuit would result.

For each data transfer, the valid data time for the outputs of link receiver detector 18 is equivalent to the interval between crossings reduced by skew between the components of link differential receiver 16 and the flip-flops of link receiver detector 18. Due to inter-symbol interference and other sources of skew, the valid data time can be significantly reduced from an entire data transfer time. Link receiver detector 18 does not explicitly extend the valid data time at the detector outputs because for a particular data transfer, the detector outputs are only valid for a time period that is reduced by skew in the flip-flops of detector 18 with respect to the valid data time at the detector inputs. However, the outputs of link receiver detector 18 can be used to determine the encoding for the two prior data transfers, which is exploited by link receiver valid data extender 22, as discussed below. Accordingly, link receiver detector 18 is capable of providing information that allows the valid data time to be expanded to an interval greater than the data transfer interval because the outputs of link receiver detector 18 outputs can be used to determine the encodings of previous data transfers.

It is possible to have the outputs of link receiver detector 18 be consumed directly by self-timed asynchronous logic if the short valid data time discussed above can be tolerated. One way to tolerate the short valid data time is to design the logic to process a data transfer even though the processing of the prior data transfer is still in progress. If two data transfers can be processed within the interval for one data transfer, this asynchronous logic implementation would not require any additional "eye opening", making the required "eye opening" for the receiver as a whole equal to the "eye opening" that is required by link receiver detector 18.

A useful early stage in the self-timed asynchronous logic would be a circuit that can store up to 3 transfers of data while requiring only a short valid data time. This early stage can extend the valid data time. Since three transfers are detected in an interval that at a minimum is slightly more than the time it takes for two transfers, subsequent self-timed asynchronous logic only needs to consume the data at a rate that exceeds the data transfer rate by less than 1.5 times. Another useful early stage in the self-timed asynchronous logic would be a circuit that encodes the data transferred into a different asynchronous data transfer protocol, such as a dual-rail non-return-to-zero encoding.

Figure 8:
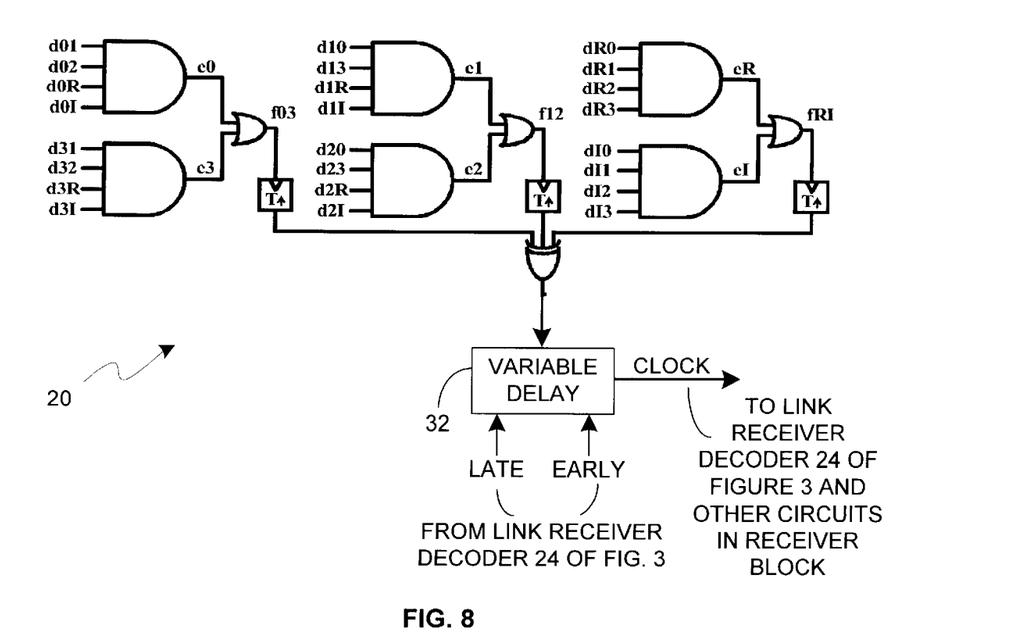
FIG. 8 is a schematic diagram of a link receiver clock recovery unit, which is part of the receiver of FIG. 3.

Having discussed a variety of issues associated with link receiver detector 18 above, now consider link receiver clock recovery unit 20. A schematic diagram of unit 20 is shown in FIG. 8. For a variety of reasons, it may be useful to recover the clock from the received data. For example, the recovered clock could be used as a local synchronous clock in the receiving block, or the recovered clock can be used to re-time the transferred data to extend the valid data time.

The first step required to recover the clock is to reconstruct the current data transfer encoding. As discussed above, when a particular encoding is transferred to the encoder inputs (the "first" transfer), five flip-flops in link receiver detector 18 of FIG. 7 are put into a known state regardless of prior data transfers. On the "second" transfer, one out of four of these five flip-flops is toggled. However, the value of the previous encoding is still reflected in the current known state of the remaining four flip-flops, which can toggle on the "third" transfer. This is how the signals e0, e3, e1, e2, eR, and eI are reconstructed in FIG. 8 to correspond to the encodings "0", "3", "1", "2", "repeat", and "invert", respectively. For each transfer, there will be a pulse on one of the signals e0, e3, e1, e2, eR, or eI. Note that outputs from only 12 of the 15 flip-flops of link receiver detector 18 are needed for clock recovery because three of the flip-flops (the left most three in FIG. 7) detect the prohibited transition to the complement value. Since e0 and e3 cannot pulse on adjacent transfers, they can be OR-ed together as shown in FIG. 8 to create the signal f03, which pulses when either the encodings "0" or "3" are transferred. Similarly, e1 and e2 are OR-ed together to form f12, and eR and eI are OR-ed together to form fRI.

Each of the signals f03, f12, and fRI are fed into an edge-triggered toggle flip-flop. On each transfer one of the three flip-flops toggles state. The XOR-ing of the outputs of the toggle flip-flops generates the recovered clock. The recovered clock will have a period of twice the data transfer interval, and the recovered clock will have a duty cycle that varies every clock period.

To minimize skew, the gates in the clock recovery circuitry should be balanced. The toggle flip-flops and XOR gate show a conceptual implementation. Since toggle flip-flops may have a long feedback loop, and making a balanced XOR gate is difficult, a better implementation uses an asynchronous state machine driven by the inputs f03, f12, and fRI to directly generate the recovered clock as one of the several state bits of the asynchronous state machine. The asynchronous state machine needs to handle the timing hazards created by two of the signals f03, f12, or fRI being briefly asserted simultaneously due to accumulated skew in the receiver circuits.

The recovered clock can be used directly or fed into circuitry that generates a clock with a more constant duty cycle. A delay-locked loop can be used to adjust both the duty cycle and phase of the recovered clock, if desired.

Note that the recovered clock signal is supplied first to variable delay 32. Variable delay 32 delays the recovered clock signal nominally by one period. However, if link receiver decoder 24 of FIG. 3 determines that the clock signal is either early or late with respect to the encoding transitions, decoder 24 can assert either the "late" or "early" signals to "tweak" the delay provided by variable delay 32, and thereby better align the clock with the encoding transitions. This will be described in greater detail below.

Figure 9:
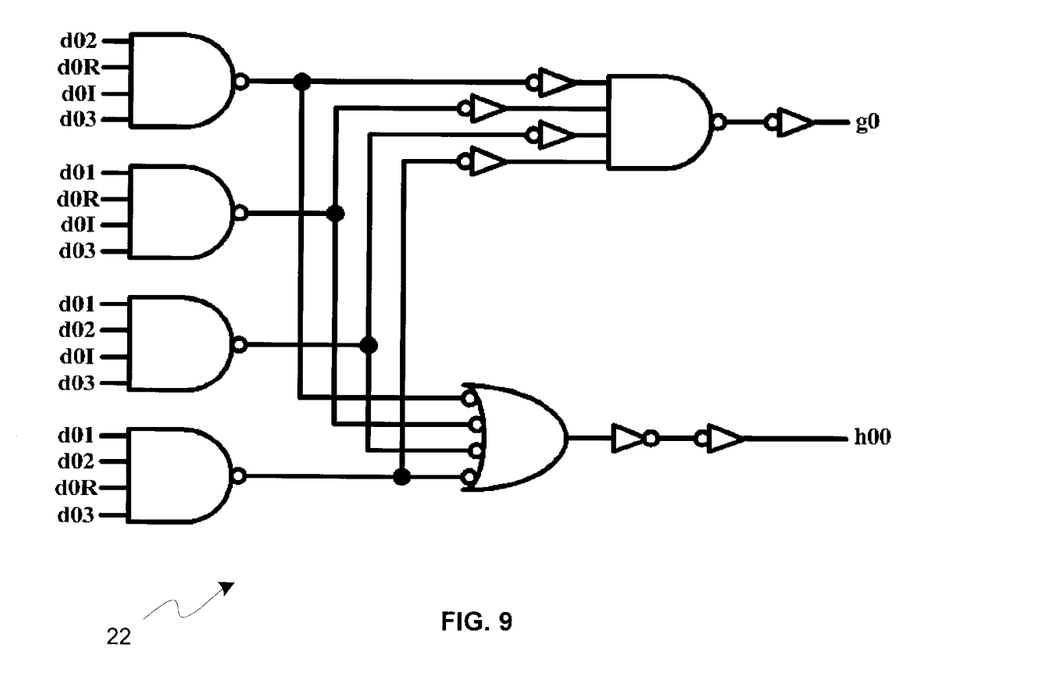
FIG. 9 shows a schematic diagram of link receiver valid data extender, which is part of the receiver of FIG. 3.

FIG. 9 shows a schematic diagram of link receiver valid data extender 22 of FIG. 3 for a single encoding (the "0" encoding). Five more instances of the circuit shown in FIG. 9 are required for the other five encodings. Extender 22 exploits the fact that link receiver detector 18 holds enough information to determine the current and prior data transfer encodings. For each encoding in the restricted transition 2-out-of-4 encoding, the "h" output of extender 22 generates a signal that is asserted if either the current or the prior data transfer is equal to that particular encoding, thereby extending the valid data time to an interval greater than the data transfer interval. Link receiver valid data extender 22 also generates a "g" output for each encoding that is asserted if the current data transfer is that particular encoding, and these outputs may be asserted for a time much shorter than a data transfer interval.

As discussed above, when a first encoding is transferred, five flip-flops in link receiver detector 18 are put into a known state. On the second transfer, one out of four of these five flip-flops is toggled. On the third transfer at least one more of the 5 flip-flops is toggled, unless this third transfer returns to the first encoding, in which case all five flip-flops are forced back into the known state.

As mentioned above, FIG. 9 shows the extender component for the "0" encoding. Output g0 is asserted when encoding "0" is received, and can be asserted for a time much less than a data transfer interval. Output h00 is asserted when encoding "0" is received in either the current or prior data transfer, and is generally asserted for a time that exceeds the data transfer interval. To minimize skew between the two outputs g0 and h00, the outputs have an equal number of gates and gate types (the NAND and inverting input OR gates are identical gates despite the different schematic symbols) between each input and output, and some of the gates are shared.

Five other instances of the circuit shown in FIG. 9 generate the signals g1, g2, g3, gR, and gI for the "1", "2", "3", "repeat" and "invert" encodings, respectively, and the signals h11, h22, h33, hRR and hII for the "1", "2", "3", "repeat" and "invert" encodings, respectively. There are no glitches on the outputs of link receiver valid data extender 22 if there are no glitches on the outputs of link receiver detector 18. Output h00 of link receiver valid extender 22 is asserted continuously beginning with a data transfer for encoding "0" and continuing until this encoding has not be transferred for two consecutive transfers.

Link receiver decoder 24 of FIG. 3 is implemented as a state machine. The state machine may either be asynchronous or synchronous. In one embodiment, decoder 24 may receive as inputs the outputs of link receiver detector 18. The synchronous version also receives as an input a recovered clock from link receiver clock recovery unit 20 (as shown in FIG. 3) that transitions within each data transfer interval.

While link receiver decoder 24 generally is either synchronous or asynchronous and may receive as inputs the outputs of link receiver detector 18, the discussion that follows will be in reference to a synchronous link receiver decoder that receives as inputs the outputs of link receiver valid data extender 22, as shown in FIG. 3.

The recovered clock for the synchronous link receiver decoder is assumed, for purposes of discussion, to operate with every period synchronized to the data transfer interval. The synchronous link receiver decoder state machine can be implemented with a recovered clock having a period of twice the data transfer interval by implementing twice as many state flip-flops, with half of these flip-flops clocked by each phase of the recovered clock.

In addition to generating decoded outputs, the link receiver decoder also generates outputs that indicate whether the recovered clock is early or late as compared to data output by link receiver valid data extender 22.

A normal operating mode may have the recovered clock synchronized to the incoming data so that the outputs indicating an early or late recovered clock are never asserted. In this mode, the data transfer encoding is captured on one of the inputs g0, g1, g2, g3, gR, or gI, which are shown collectively as gZ in FIG. 3, on every clock. Note that the signals h00, h11, h22, h33, hRR, and hII are also shown collectively in FIG. 3 as hZ. In this mode, the only remaining task for link receiver decoder 24 is to remove the "repeat" and "invert" encodings from the data transfer stream by repeating or inverting the prior data held in the state vector of the state machine.

Figure 10:
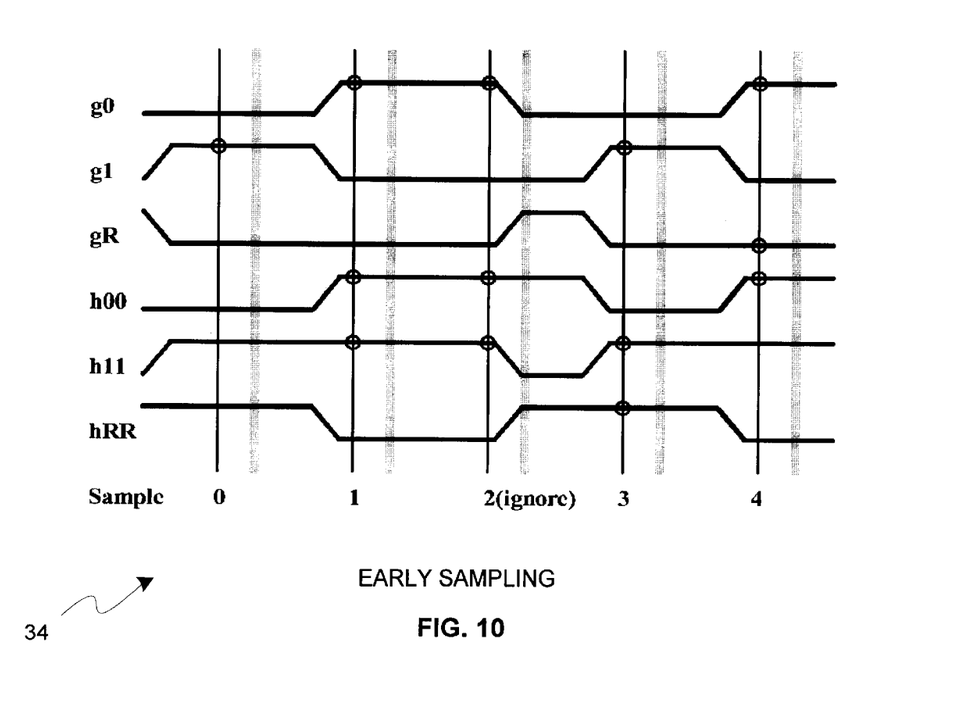
FIG. 10 is a timing diagram illustrating an example of early sampling.

Timing diagram 34 in FIG. 10 shows the case of early sampling. The shaded vertical bars show where sampling is desired. The numbered vertical bars show that sampling is actually occurring early. Signals g2, g3, gI, h22, h33, and hII are not shown and have a value of "0". Assume that sample 0 correctly sampled signal g1 as shown at the circle at the intersection of signal g1 and line 0.

At sample 1, signals g0, h00, and h11 are sampled asserted ("1") as shown by circles at the intersections of the respective signals and the line 1. To validate that the sampled data represents the "0" encoding, decoder 24 attempts to verify that exactly one of the signals g0, g1, g2, g3, gR, or gI is asserted, exactly two of the signals h00, h11, h22, h33, hRR, or hII are asserted, that the two signals h00, h11, h22, h33, hRR, or hII that are asserted correspond to the signals g0, g1, g2, g3, gR, or gI sampled as being asserted in the current and prior sample, and that the signal g0, g1, g2, g3, gR, or gI that is asserted in the current sample is not either the same or for the complement encoding in the prior sample.

Assume that due to some condition, such as inter-symbol interference, the transition after sample 1 occurs later than normal. Because sample 2 is taken early, the sample is taken just prior to the transition, so the wrong data is sampled. In sample 2, the signals g0, h00, and h11 are again sampled as being asserted, as shown by circles at the corresponding intersections. This sample fails the validity check since sampling h11 as being asserted requires that g1 was sampled as being asserted in the current or prior sample, which is not the case, and also because g1 was asserted in the prior sample.

One way of handling the bad sample is to ignore it. If the following sample is good then the data for the ignored sample can be recovered. In sample 3, g1, h11, and hRR are sampled as being asserted. Since the prior sample had an error and was ignored, fewer checks are done to validate the data. To validate the sample decoder 24 attempts to verify that exactly one of the signals g0, g1, g2, g3, gR, or gI is asserted, exactly two of the signals h00, h11, h22, h33, hRR, or hII are asserted, and the signal g0, g1, g2, g3, gR, or gI being asserted corresponds to one of the two signals h00, h11, h22, h33, hRR, or hII being asserted. If this check fails, unrecoverable data corruption has occurred, which decoder 24 signals on the error line shown FIG. 3.

The signal h00, h11, h22, h33, hRR, or hII that is being asserted and that does not have a corresponding signal g0, g1, g2, g3, gR, or gI that is being asserted is the recovered data for the prior sample having the error. In sample 3, the current data is the encoding "1" since g1 and h11 are sampled as being asserted. The data for the sample prior to sample 3 (sample 2) is recovered as the encoding for "R" since hRR was asserted in sample 3. Based on this scenario, detector 24 can generate an "early" signal and provide the "early" signal to link receiver clock recovery unit 20. Unit 20 can then adjust the variable delay 32 as discussed above with reference to FIG. 8.

Figure 11:
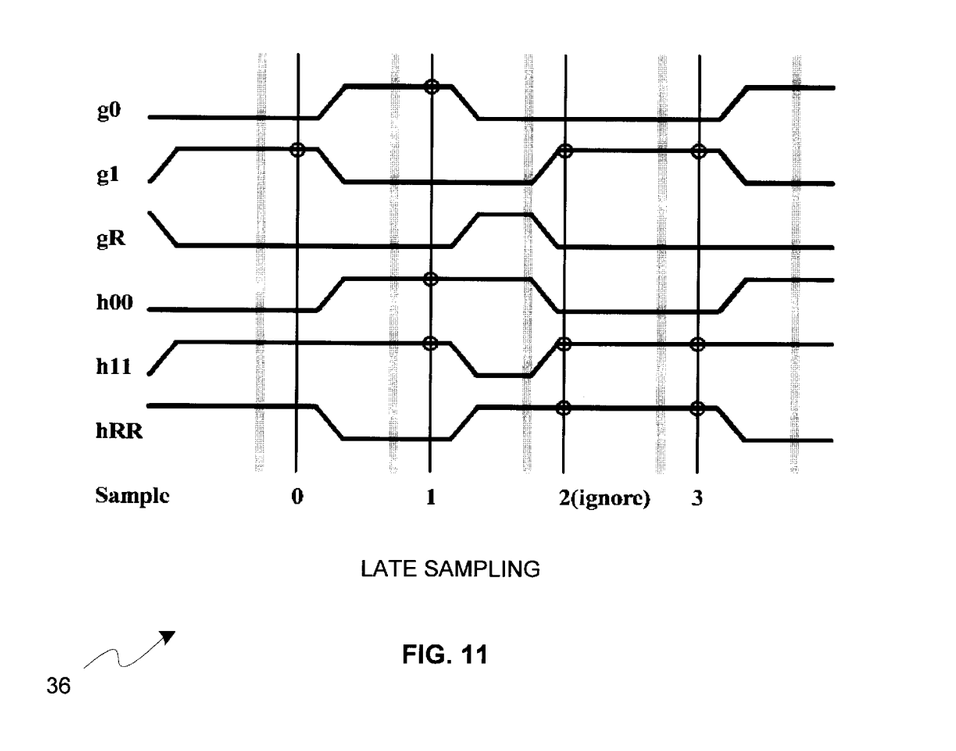
FIG. 11 is a timing diagram illustrating an example of late early sampling.

FIG. 11 shows a timing diagram 36 that illustrates the case of late sampling. Assume that due to some condition, such as inter-symbol interference, the transition before sample 3 occurs earlier than normal. This causes sample 2 to be taken after two transitions are made, so the sampling for one transfer is missed. Sample 2 fails the checks since hRR is sampled as being asserted, but gR was not sampled as being asserted in either the current or prior sample. Recovery can again be done by ignoring the bad sample. When sample 3 is taken with g1, h11, and hRR being asserted, the current data is for encoding "1" and the prior data is recovered as encoding "R". Based on this scenario, detector 24 can generate a "late" signal and provide the "late" signal to link receiver clock recovery unit 20. Unit 20 can then adjust the variable delay 32 as discussed above with reference to FIG. 8.

Link receiver decoder 24 permits recovery from isolated sampling errors. Decoder 24 will decode the correct data even when the sampling window for an isolated transfer is reduced to zero. So for isolated cases, link receiver decoder 24 does not require any additional "eye opening" beyond the "eye opening" required by link receiver detector 18. In most cases, an "early" or "late" signal can be generated, as discussed above.

In some scenarios, such as sampling errors while the data transfer stream is alternating between two encodings, it cannot be determined whether the sampling is early or late. In such scenarios, data recovery can still be done for isolated sampling errors. For example, the link receiver detector state machine could output a "bad" sampling indication.

An alternate sampling error recovery strategy would be to not attempt recovery of the badly sampled data, but just flag an error and the need to adjust the phase of the recovered clock. This could be done by sending a training sequence that includes the worst case sampling conditions and adjusting the phase of the recovered clock to find the early and late sampling conditions, and finally setting the phase of the recovered clock to halfway between the early and late sampling conditions before resuming normal operation.

In conclusion, the present invention provides a receiver capable of receiving the restricted transition 2-out-of-4 encoding described above. While the receiver may be more complex than a receiver for a prior art differential pair, there are many advantages provided by the present invention. In the design cycle of a digital system, significant resources and design attention need to be devoted to clock distribution networks. Transistor densities and clock frequencies of integrated circuits (ICs) are increasing at a relatively fast pace in comparison to I/O pin counts and printed circuit board (PCB) fabrication methods. As transistor densities of ICs increase, it becomes less expensive to provide an IC with receiver circuits in accordance with the present invention. Furthermore, by simplifying (or even eliminating) clock distribution networks, I/O pin counts and the number of PCB traces can be reduced. Also, significantly less design attention is required when designing transmission paths between sending and receiving paths because clock-to-data skew is not a concern. Accordingly, the present invention is well suited to exploit the current development trends in art of digital systems.

Although the present invention has been described with reference to preferred embodiments, workers skilled in the art will recognize that changes may be made in form and detail without departing from the spirit and scope of the invention.

What is claimed is:

1. A receiver for receiving data comprising:
inputs for receiving groups of at least four input signals that represent self-clocking protocol encodings transmitted from a source, wherein two identical encodings are prohibited from being transmitted twice in a row and two or more of the input signals have the same predetermined value for any encoding;
a differential receiver coupled to the input signals wherein the differential receiver detects differential transitions between any pair of input signals, and provides an encoding output that identifies a received encoding; and
a decoder coupled to the encoding output, for extracting data from the received encoding.

2. The receiver of claim 1 wherein information derived from current and previous encodings is stored which contains data that represents each possible transition from one encoding to another.

3. The receiver of claim 1 wherein clock signals are recovered from transitions in signals derived from the data that represents each possible transition from one encoding to another.

4. The receiver of claim 1 wherein a first signal is asserted when a corresponding encoding is received.

5. The receiver of claim 4 wherein a second signal is asserted when a corresponding encoding is received and remains asserted for one additional encoding transition.

6. The receiver of claim 5 wherein the first signal and the second signal are used to produce decoded data.

7. The receiver of claim 1 wherein the decoder generates outputs that indicate whether a recovered clock signal is early or late.

8. The receiver of claim 1 wherein a recovered clock signal is synchronized to incoming data.

9. The receiver of claim 1 wherein a sample is used to verify the validity of data that is being received.

10. The receiver of claim 9 wherein the sample is validated by verifying that at least the first signal and a plurality of the second signals have been asserted and an asserted signal corresponds to one of the plurality of second signals.

11. The receiver of claim 1 wherein said receiver detects when there are changes in two signals with the highest received voltage as compared to the higher of two remaining signals.

12. The receiver of claim 1 wherein a valid data time for outputs for the receiver is equivalent to the interval between crossings reduced by skew between the components of the receiver.

13. The receiver of claim 12 wherein outputs of components of the receiver can be used to determine the encodings for two prior data transfers.

14. The receiver of claim 13 wherein a receiver component provides information that allows the valid data time to be expanded to an interval greater than the data transfer interval when the output of the component is used to determine the encodings of the previous data transfers.

15. A self clocking link protocol comprising:
accommodating a plurality of encodings, wherein each encoding has at least a predetermined number of signals of a specified value;
prohibiting the transmission of a previously transmitted encoding or its complement immediately after the previously transmitted encoding has been transmitted;
restricting a transition from an encoding back to the same encoding such that at least some encoding signals always change in a transition;
prohibiting either of the signals that changed in a prior transition from changing in a current transition; and
changing individual signals at a worst case rate that is half of the data transfer rate.

16. The protocol of claim 15 wherein a time out interval is enforced after the detection of a first differential transition when a predetermined number of encoding signals are allowed to change.

17. The protocol of claim 15 wherein one of the plurality of encodings comprises a "repeat" encoding which is transmitted when an attempt is made to transmit a previously transmitted encoding immediately after the previously transmitted encoding has been transmitted.

18. The protocol of claim 15 wherein one of the plurality of encodings comprises a "invert" encoding which is transmitted when an attempt is made to transmit the complement of a previously transmitted encoding immediately after the previously transmitted encoding has been transmitted.

19. A driver for transmitting data comprising:
   driver inputs for receiving a plurality of input signals;
   driver outputs for outputting at least four output signals that carry self clocking protocol encodings; and
   a driver encoder coupled to receive the values carried via the input signals and supply the self clocking protocol encodings via the output signals, wherein the driver encoder encodes the input signals such that two or more of the output signals have the same predetermined value for each encoding and wherein the driver encoder prohibits identical encodings from being transmitted twice in a row and wherein both edges in the differential transition are caused by the transition of a single input.

20. The driver of claim 19 wherein the driver comprises a differential amplifier wherein a reference voltage of the differential amplifier lies within a middle range of the differential amplifier.

21. The driver of claim 20 wherein for any transition one signal set maintains its prior value.

22. The driver of claim 19 wherein next state values are a function of the inputs provided to the driver.

23. The driver of claim 19 wherein the input signals comprise a next value to be encoded.

24. The driver of claim 19 wherein the driver uses data to be transmitted as well as the data transmitted in the last transfer to generate signals.

25. The driver of claim 19 wherein for every encoding a differential transition occurs at the driver outputs.

* * * * *